United States Patent
Wong

[11] Patent Number: 5,863,351
[45] Date of Patent: Jan. 26, 1999

[54] METHOD FOR CLEANING AN OBJECT SOLDERED WITH A LEAD-CONTAINING SOLDER

[75] Inventor: Ching-Ping Wong, Lawrenceville, N.J.

[73] Assignee: Lucent Technologies, Inc., Murray Hill, N.J.

[21] Appl. No.: 686,274

[22] Filed: Jul. 25, 1996

Related U.S. Application Data

[63] Continuation of Ser. No. 598,587, Feb. 12, 1996, abandoned, which is a continuation of Ser. No. 220,478, Mar. 31, 1994, abandoned.

[51] Int. Cl.$^6$ .............................. B08B 3/04; B08B 3/08; B01D 15/04
[52] U.S. Cl. .................................. 134/26; 10/38; 10/40; 10/42; 210/689
[58] Field of Search ................................. 134/10, 26, 38, 134/40, 42; 210/689

[56] References Cited

U.S. PATENT DOCUMENTS

| 3,080,433 | 3/1963 | Hengstebeck | 210/689 |
| 4,368,126 | 1/1983 | Audeh, et al | 210/663 |
| 4,460,476 | 7/1984 | McCaffrey et al. | 210/689 |
| 4,640,719 | 2/1987 | Hayes et al. | 134/40 |
| 4,726,818 | 2/1988 | Yeung et al. | 55/33 |
| 4,740,247 | 4/1988 | Hayes et al. | 134/32 |
| 5,328,518 | 7/1994 | Hamilton et al. | 134/10 |

OTHER PUBLICATIONS

"Aqueous and Semi–Aqueous Cleaning Processes," G.M. Wenger et al., AT&T *Technical Journal* Vol. 71, No. 2, Mar./Apr, 1992, pp. 45–51.

"The Encyclopedia of Chemistry," Third Edition, edited by C.A. Hampel and G.G. Hawley, Van Nostrand Reinhold Company, New York et al., 1973, pp. 685–687 No Month.

*Primary Examiner*—Zeinab El-Arini

[57] ABSTRACT

Minute quantities of water in a terpene cleaning solvent cause a reaction with certain metals, particularly lead, tin and copper, which reactions are responsible for corrosion of the metal. Such reactions can be reduced or substantially eliminated by exposing the cleaning solvent to a molecular sieve prior to the cleaning operation. The molecular sieve typically includes a plurality of beads of zeolite to which the cleaning solvent is exposed. The molecular sieve traps the water molecules from the solvent so that, after treatment, the solvent contains substantially no water molecules.

8 Claims, 1 Drawing Sheet

METHOD FOR CLEANING AN OBJECT SOLDERED WITH A LEAD-CONTAINING SOLDER

This application is a continuation application Ser. No. 08/598,587, filed on Feb. 12, 1996, and now abandoned, which is a continuation of application Ser. No. 08/220,478, filed on Mar. 31, 1994, and now abandoned.

TECHNICAL FIELD

This invention relates to cleaning methods and, more particularly, to methods for cleaning electronic devices.

BACKGROUND OF THE INVENTION

One step in the fabrication of modem electronic devices such as printed wiring boards (PWBs) is the use of solder flux, normally a rosin, to insure good bonding of solder elements to copper conductors of the PWBs. After the soldering operation, residual rosin flux must be cleaned from the PWB, and for years this was done by using cleaning solvents comprising chlorinated hydrocarbons or chlorinated fluorocarbons (CFCs). The patents of Hayes et al., U.S. Pat. No. 4,740,247 and U.S. Pat. No. 4,640,719, incorporated herein by reference, point out that such solvents are harmful to the environment, and that residual rosin flux can effectively be removed by a cleaning solvent having terpene as its active ingredient, which in turn can be rinsed with water. Terpene compositions are biodegradable, non-toxic and are essentially harmless to the environment.

A system for cleaning PWBs with terpene compositions is described in the paper, "Aqueous and Semi-Aqueous Cleaning Processes," G. M Wenger et al., *AT&T Technical Journal*, Vol. 71, No. 2, March/April 1992, pp. 45–51, incorporated herein by reference. It is preferred that the PWBs be submerged in the terpene composition prior to rinsing, and apparatus for accomplishing this is described. PWBs that have been cleaned as described in the Wenger et al. paper have unfortunately been found to be susceptible to failure. Microscopic examinations of the component printed circuits, bonding pads and solder elements have shown that the failures are due to corrosion which, for example, may cause a solder element to break, thereby forming an open circuit. It is of course important that the causes of such corrosion be isolated and reduced or eliminated.

SUMMARY OF THE INVENTION

In my study of the cleaning process described above, I have determined that minute quantities of water in the terpene composition cause a reaction of the composition with certain metals, particularly lead, tin and copper, which reactions are responsible for the corrosion. I have further found that such reactions can be reduced or substantially eliminated by exposing the cleaning solvent to a molecular sieve prior to the cleaning operation. The molecular sieve typically comprises a plurality of beads of zeolite through which the cleaning solvent may be flowed. The molecular sieve preferably has pore sizes of from three to five angstroms which trap the water molecules from the solvent so that, after treatment, it contains substantially no water molecules. This inexpensive process has been found to substantially eliminate or to reduce the corrosion responsible for printed wiring board failure.

These and other objects, features and benefits of the invention will be better understood from a consideration of the following detailed description taken in conjunction with the accompanying drawing.

DETAILED DESCRIPTION

Figure 1:
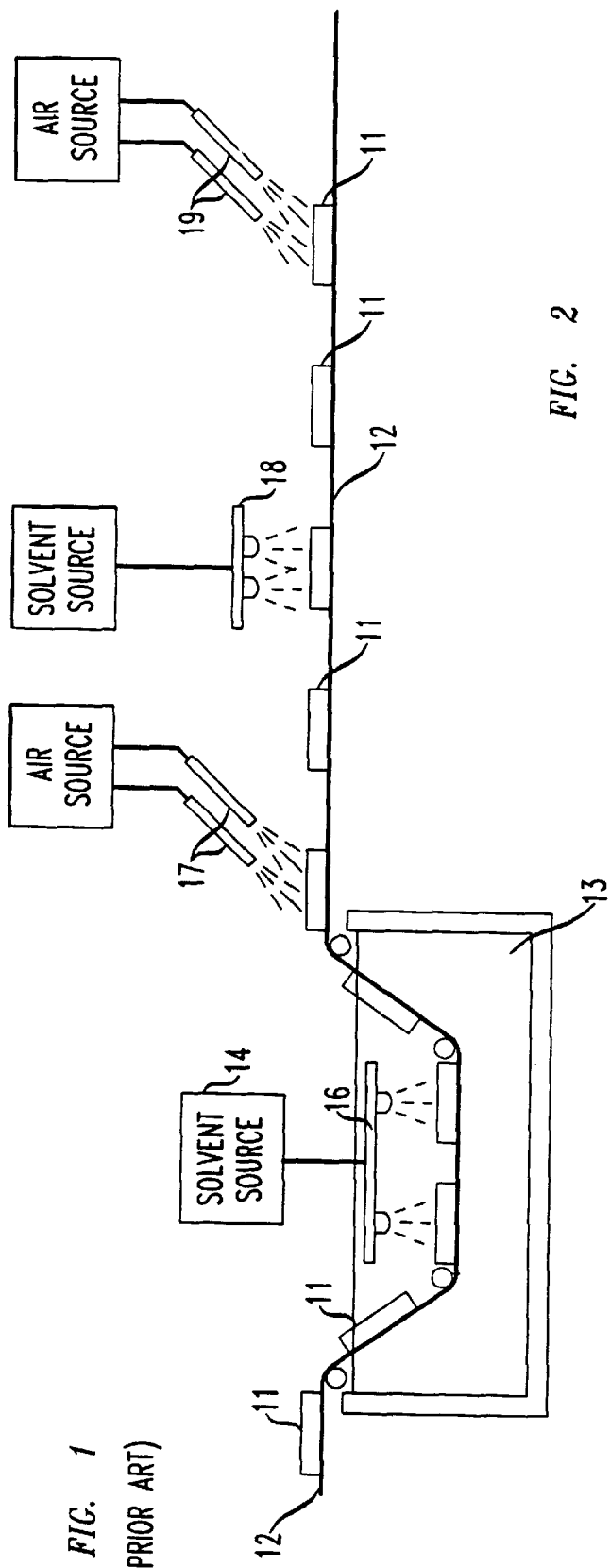
FIG. 1 is a schematic representation of a method for cleaning printed wiring boards with a terpene composition as is known in the prior art.

Referring now to FIG. 1, there is shown schematically apparatus for cleaning printed wiring boards (PWBs) using a terpene composition, the apparatus and method being described more fully in the aforementioned Wenger et al. paper. A plurality of PWBs 11 to be cleaned are placed on a conveyor belt 12 which moves them from left to right, as indicated by the arrow. The printed wiring boards are first submerged in a cleaning solvent 13 which comprises a terpene composition along with a surfactant. Solvent from a source 14 is forcefully directed at surfaces of the submerged printed wiring boards by a spray bar 16. Cleaning in this manner minimizes the possibility of an accidental explosion caused by vaporized solvent. Hybrid integrated circuits, that is, devices comprising ceramic or semiconductor substrates each having at least one printed circuit on at least one surface and that supports one or more integrated circuit chips, are also commonly cleaned by this process; for purposes of this document, a hybrid integrated circuit should be considered to be the equivalent of a PWB.

After exposure to the cleaning solvent, the printed wiring boards 11 are directed past a plurality of air jets 17 which direct air forcefully at the surfaces of each PWB to blow away most of the residual solvent. The PWBs 11 are next rinsed by water applied by a spray bar 18. After rinsing, they are again exposed to air jets 19 which remove and dry water from the surfaces. As is described in the Wenger et al. paper, cleaning with the solvent and rinsing with water are normally done in two separate machines; these functions are shown as being combined in FIG. 1 only for reasons of brevity. The above cleaning method is considered a major advance in the art because the solvent is capable of cleaning oils, greases and residual solder flux, a form of rosin, from PWBs without causing serious air or water pollution, as is true of previously used solvents.

PWBs cleaned as described above have, however, been found to be susceptible to corrosion. In particular, solder joints used for surface mounting or "flip-chip" mounting of integrated circuit chips, and which carry fairly high currents, have been found to be particularly susceptible to corrosion and consequent failure. In accordance with an illustrative embodiment of the invention, this problem is alleviated or avoided by first treating the solvent through the use of apparatus such as that shown in FIG. 2. A pump 21 circulates solvent from a tank 22, as shown by the arrows. The solvent is directed through a molecular sieve 23 which may comprise a plurality of beads of zeolite held between a pair of screens 24. As is described, for example, in "The Encyclopedia of Chemistry," Third Edition, edited by C. A. Hampel and G. G. Hawley, Van Nostrand Reinhold Company, New York et al., 1973, pp. 685–687, a molecular sieve is a material that can separate small molecules from large molecules. It can be shown that water molecules contained in the solvent 13 of FIG. 1 have smaller diameters than either the molecules of the terpene composition or the pores of the molecular sieve. Thus, a four angstrom molecular sieve such as zeolite can be used to remove selectively water molecules from the solvent, which is directed through it in the apparatus of FIG. 2. The mesh of screens 24 is smaller than the diameter of the zeolite beads, and the beads that make up the molecular sieve 23 filter water from the solvent pumped through it. After treatment, the solvent is used as shown in FIG. 1.

Figure 2:
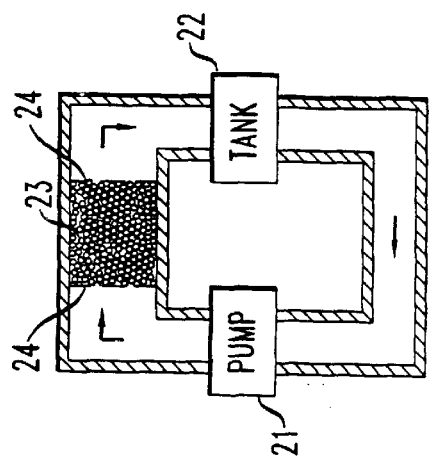
FIG. 2 is a schematic view of apparatus for exposing cleaning solvents to a molecular sieve in accordance with an illustrative embodiment of applicant's invention.

The apparatus of FIG. 2 represents one possible method of exposing the solvent to the molecular sieve in a production environment. The invention has thus far been used only in a laboratory environment. The cleaning solvent that was used comprised about ninety percent by weight of d-limonene (a terpene) and ten percent by weight of an aliphatic ester surfactant; such solvent is commercially available under the trade name EC-7R from Petraferm, Inc. of Fernandina Beach, Fla. The molecular sieve that was used was zeolite 3A and 4A, which is available from the Alpha Research Chemicals and Materials Company of Danvers, Mass. The designations 3A and 4A refer to three angstroms and four angstroms, the sizes of the pores in the zeolite beads. Pores of this size selectively capture the water molecules without affecting other components of the solvent. The molecular sieve treatment appears substantially to eliminate the corrosion problem referred to above. Pore sizes of 2 to 5 Angstroms are considered useful in this regard.

Samples of lead have been placed in EC-7R, which resulted in the formation of detectable lead oxide within a few minutes of exposure. Other lead pellets were immersed in EC-7R that had been treated by the molecular sieve, and after two months they showed no formation of lead oxide. Analysis of EC-7R shows that it contains about one hundred to about one thousand parts per million of $H_2O$, and it is clear that in a terpene environment, such water reacts with lead. Analysis of a related terpene composition, EC-7, also available from Petraferm, Inc., showed it to have approximately the same water content. Exposure to 3A and 4A zeolite is effective in substantially eliminating all traces of $H_2O$ in the solvent. Therefore, in a production environment, it is recommended that about one pound of zeolite be used for each one hundred pounds of solvent. It is expected that the one pound of zeolite would be capable of removing 0.1 pound of $H_2O$, which should be sufficient to clear one hundred pounds of terpene solvent of all $H_2O$. After use, the zeolite can be dehydrated and reused.

Microscopic examination has shown that tin, copper and lead alloys are all susceptible to corrosion when cleaned without the invention as shown in FIG. 1, though the corrosion rates are lower than that of pure lead. Pure lead appears to be the most susceptible to corrosion, but common tin-lead solders, particularly those with a tin content of less than three percent, can corrode sufficiently to cause malfunction of electronic circuits. Of course, circuits carrying high voltages or currents are especially susceptible since, as is known, the increased impedance of corroded elements results in local heat generation.

The presence of minute quantities of $H_2O$ in terpene compositions appears to be an inherent consequence of the production of such compositions. It appears that such compositions cannot be made without such small water components, and no practical way of removing them is known except by using molecular sieves. It is possible that distilling or other dehydrating techniques could be developed which would remove the water content of the composition, but it would seem that such techniques would inevitably be much more expensive than the molecular sieve process.

The foregoing embodiments are intended to be merely illustrative of the inventive concept. Various other embodiments and modifications could be made by those skilled in the art without departing from the spirit and scope of the invention.

I claim:

1. A method for cleaning an object soldered with a lead-containing solder the method comprising the steps of:

a) passing a terpene-based cleaning solvent through a molecular sieve comprising a zeolite that selectively captures and removes water molecules from the solvent, such that all traces of water in the solvent are substantially eliminated and the solvent is substantially non corrosive towards lead;

b) then contacting the object with the cleaning solvent; and c) then removing residual cleaning solvent from the object by blowing.

2. The method of claim 1, wherein the contacting step comprises submerging the object in the cleaning solvent.

3. The method of claim 1, wherein the object is an electronic device designed to conduct electricity.

4. The method of claim 1, further comprising, after removing residual cleaning solvent from the object, rinsing the object with water.

5. The method of claim 1, wherein the object is a printed wiring board comprising a plurality of solder elements comprising tin and lead that are designed to conduct electricity.

6. The method of claim 1, wherein the cleaning solvent comprises about 90% by weight of d-limonene and about 10% by weight of an aliphatic ester surfactant.

7. The method of claim 1, wherein the zeolite has pores having diameters of at least 2, but not more than 5, angstroms.

8. The method of claim 1, wherein the step of passing cleaning solvent through a molecular sieve is carried out such that approximately one pound of zeolite is used for each one hundred pounds of cleaning solvent.

* * * * *